(12) United States Patent
Qi et al.

(10) Patent No.: US 9,054,198 B2
(45) Date of Patent: Jun. 9, 2015

(54) PIXEL UNIT STRUCTURE, ARRAY SUBSTRATE AND DISPLAY DEVICE

(71) Applicants: BOE TECHNOLOGY GROUP CO., LTD., Beijing (CN); Chengdu BOE Optoelectronics Technology Co., Ltd., Chengdu (CN)

(72) Inventors: Xiaojing Qi, Beijing (CN); Bo Wu, Beijing (CN); Like Hu, Beijing (CN)

(73) Assignees: BOE Technology Group Co., Ltd., Beijing (CN); Chengdu BOE Optoelectronics Technology Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 14/081,244

(22) Filed: Nov. 15, 2013

(65) Prior Publication Data
US 2014/0131717 A1    May 15, 2014

(51) Int. Cl.
| | |
|---|---|
| *H01L 29/04* | (2006.01) |
| *H01L 29/10* | (2006.01) |
| *H01L 27/14* | (2006.01) |
| *H01L 29/786* | (2006.01) |
| *H01L 27/32* | (2006.01) |

(Continued)

(52) U.S. Cl.
CPC ...... *H01L 29/78654* (2013.01); *H01L 27/3248* (2013.01); *H01L 29/4908* (2013.01); *H01L 27/3265* (2013.01); *H01L 27/3244* (2013.01); *H01L 29/41733* (2013.01); *G02F 1/136213* (2013.01); *H01L 29/78633* (2013.01); *H01L 27/1218* (2013.01); *H01L 27/1255* (2013.01)

(58) Field of Classification Search
CPC ............ H01L 29/4908; H01L 27/3244; H01L 29/41733; H01L 27/3248; H01L 27/3265
USPC ............................................. 257/59, 72, 350
See application file for complete search history.

(56) References Cited

U.S. PATENT DOCUMENTS

| | | | |
|---|---|---|---|
| 6,493,046 | B1 | 12/2002 | Ueda |
| 6,583,828 | B1 | 6/2003 | Wada et al. |

(Continued)

FOREIGN PATENT DOCUMENTS

| | | |
|---|---|---|
| CN | 1379276 A | 11/2002 |
| CN | 101169565 A | 4/2008 |

(Continued)

OTHER PUBLICATIONS

Chinese Office Action dated Jan. 14, 2014 regarding Application No. 2012105011395. Translation provided by Dragon Intellectual Property Law Firm.

(Continued)

*Primary Examiner* — Ngan Ngo
(74) *Attorney, Agent, or Firm* — Harness, Dickey & Pierce, P.L.C.

(57) ABSTRACT

The invention discloses a pixel unit structure, an array substrate and a display device and relates to the technical field of liquid crystal displays. The pixel unit structure has a storage capacitor and has a high aperture ratio and a low manufacturing cost of the pixel unit. The pixel unit structure comprises a thin film transistor (TFT) and a first barrier layer, wherein the first barrier layer is opposite to a drain region of an active layer of the TFT, and is connected to a common electrode of an array substrate, thereby a capacitor can be formed between the first barrier layer and the drain region of the active layer.

20 Claims, 4 Drawing Sheets

(51) Int. Cl.
  *H01L 29/49* (2006.01)
  *H01L 29/417* (2006.01)
  *G02F 1/1362* (2006.01)
  *H01L 27/12* (2006.01)

(56) References Cited

U.S. PATENT DOCUMENTS

| | | |
|---|---|---|
| 2003/0202149 A1 | 10/2003 | Miyajima et al. |
| 2008/0067519 A1 | 3/2008 | Sakurai et al. |
| 2012/0146030 A1* | 6/2012 | You et al. .................... 257/59 |
| 2012/0228607 A1* | 9/2012 | Miyairi et al. ............... 257/43 |
| 2013/0026462 A1* | 1/2013 | Takei et al. .................. 257/43 |
| 2014/0246669 A1* | 9/2014 | Miyairi et al. ............... 257/43 |

FOREIGN PATENT DOCUMENTS

| | | |
|---|---|---|
| CN | 102053439 A | 5/2011 |
| EP | 1022786 A2 | 7/2000 |
| EP | 1245996 A2 | 10/2002 |
| JP | 2000276076 A | 10/2000 |
| KR | 100500739 B1 | 10/2005 |

OTHER PUBLICATIONS

Chinese Office Action dated Jun. 17, 2014 regarding Application No. 201210501139.5. Translation provided by Dragon Intellectual Property Law Firm.

Chinese Office Action dated Mar. 31, 2014 regarding Application No. 2012105011395. Translation provided by Dragon Intellectual Property Law Firm.

European Search Report dated Feb. 17, 2014 regarding Application No. 13192998.6-1508.

Korean Office Action dated Sep. 29, 2014 regarding Application No. 10-2013-0138186. Translation provided by Dragon Intellectual Property Law Firm.

* cited by examiner

PIXEL UNIT STRUCTURE, ARRAY SUBSTRATE AND DISPLAY DEVICE

CROSS-REFERENCE TO RELATED APPLICATIONS

This application claims priority from Chinese Patent Application No. 201210459334.6, filed Nov. 15, 2012 and Chinese Patent Application No. 201210501139.5, filed Nov. 29, 2012, which are also hereby incorporated herein by reference.

BACKGROUND OF THE INVENTION

1. Field of the Invention

The present invention relates to the field of liquid crystal displays, and in particular, to a pixel unit structure, an array substrate and a display device.

2. Description of the Prior Art

Thin Film Transistor Liquid Crystal Display (TFT-LCD) occupies a leading position in the field of flat panel displays due to its advantages of small volume, low power consumption and no irradiation.

According to different forms of electric fields, LCD may be divided into various types, wherein, Advanced super Dimension Switch (ADS)-type TFT-LCD is applied widely due to its advantages of wide visual angle, high aperture ratio and high transmissibility, etc. Wherein, a multidimensional-space combination electric field is formed by a parallel electric field generated at the edge of pixel electrodes in the same plane and a longitudinal electric field generated between a pixel electrode layer and a common electrode layer, and the potential difference between the pixel electrode and the common electrode may makes a liquid crystal molecule to rotate, so that all the aligned liquid crystal molecules between and above the pixel electrodes in a liquid crystal cell can generate rotate switching, and the variation of the transmittance of the liquid crystal layer may be controlled via different potential differences, thus different gray levels may be formed on the liquid crystal display, thereby display may be implemented.

During the process of implementing the present invention, the inventors find that in the time interval of single frame, a certain potential difference between a certain pixel electrode and the common electrode must be kept, so that the liquid crystal between the pixel electrode and the common electrode is kept in a certain arrangement. However, so long as a liquid crystal display operates, the potential of the common electrode will be kept constant, thus the potential of the pixel electrode also needs to be kept unchanged in the time interval of single frame, so that a storage capacitor needs to be provided in the pixel unit, which helps to enhance the capability of maintaining potential of the pixel electrode. However, after the storage capacitor is added, the aperture ratio of the pixel unit will be reduced. At the same time, the increase of the storage capacitor means that the processes for manufacturing the mask of the pixel unit structure becomes complex, thereby the manufacturing cost of the pixel unit structure will be increased.

SUMMARY OF THE INVENTION

The technical problem to be solved by the invention is to provide a pixel unit structure, an array substrate and a display device. In the pixel unit structure, a storage capacitor can be provided while the pixel unit structure has a high aperture ratio and a low manufacturing cost.

In order to solve the above technical problem, the pixel unit structure and the array substrate according to the invention employs the following technical solutions:

A pixel unit structure is provided, which comprises a thin film transistor (TFT) and a first barrier layer, wherein the first barrier layer is opposite to a drain region of an active layer of the TFT, and is connected to a common electrode of an array substrate, and a capacitor is formed between the first barrier layer and the drain region of the active layer.

Further, the thin film transistor comprises an active layer, a second insulating layer, a gate electrode, and a source electrode and a drain electrode located on the same layer, wherein the source electrode is connected to a data line of the pixel unit structure and a source region of the active layer, and the drain electrode is connected to a pixel electrode of the pixel unit structure and a drain region of the active layer.

The pixel unit structure further comprises a second barrier layer located on the same layer with the first barrier layer, wherein the second barrier layer is opposite to the region of the active layer other than the drain region.

When the drive mode of the pixel unit structure is ADS mode, the pixel unit structure further comprises:

a third insulating layer, a fourth insulating layer, a common electrode layer, a fifth insulating layer and a pixel electrode provided on the third insulating layer in turn, wherein the third insulating layer, the fourth insulating layer and the fifth insulating layer all have via holes, and each of the via holes is filled with a conducting material connected with each other, wherein the drain electrode or the source electrode of the active layer is connected to the pixel electrode via the conducting material connected with each other.

The active layer is formed of monocrystalline silicon, or is formed of lightly doped polysilicon and heavily doped polysilicon alternately.

The pixel unit structure has at least one gate electrode, and is opposite to the monocrystalline silicon or the lightly doped polysilicon in the active layer.

The material of the source region and the drain region of the active layer is heavily doped polysilicon.

The first barrier layer and the second barrier layer are formed integrally.

An array substrate is provided, which comprises a substrate and a plurality of above-described pixel unit structures located on the substrate. Wherein a first barrier layer of each of the pixel unit structures is connected to the common electrode of the array substrate, respectively. Alternatively, the first barrier layers of the pixel unit structures are connected with each other in series, and then they are connected to the common electrode of the array substrate.

The invention further provides a display device, which comprises the array substrate.

In the pixel unit structure according to the invention, a capacitor can be formed between the first barrier layer and the drain electrode connected with the pixel electrode of the active layer, so that a storage capacitor can be provided in the pixel unit structure. Additionally, because the first barrier layer that can form storage capacitor with the drain electrode is opposite to the drain electrode that is connected with the pixel electrode, the aperture ratio of the pixel unit structure will not be influenced, and a high aperture ratio of the pixel unit structure can be obtained.

BRIEF DESCRIPTION OF THE DRAWINGS

In order to more clearly illustrates the technical solutions of the invention or the prior art, the drawings required in the description of the embodiment will be introduced briefly.

Obviously, the drawings in the following description are only some embodiments of the invention, and for one of ordinary skills in the art, other drawings may also be obtained according to these drawings without creative work.

REFERENCE NUMBERS

1 First Barrier Layer
2 First Insulating Layer
3 Active Layer
4 Second Insulating Layer
5 Gate Electrode
6 Source Electrode
7 Drain Electrode
8 Third Insulating Layer
9 Pixel Electrode
10 Second Barrier Layer
11 Fourth Insulating Layer
12 Common Electrode Layer
13 Fifth Insulating Layer
14 Via Hole
15 Substrate

DETAILED DESCRIPTION OF THE PREFERRED EMBODIMENTS

The technical solutions of the embodiments of the invention will be described clearly and fully below in conjunction with the drawings in the embodiments of the invention, and obviously, the embodiments described are only a part of the embodiments of the invention, rather than the whole embodiments. Other embodiments made by one of ordinary skills in the art based on the embodiments of the invention without creative work all fall into the protection scope of the invention.

Embodiment 1

Figure 1:
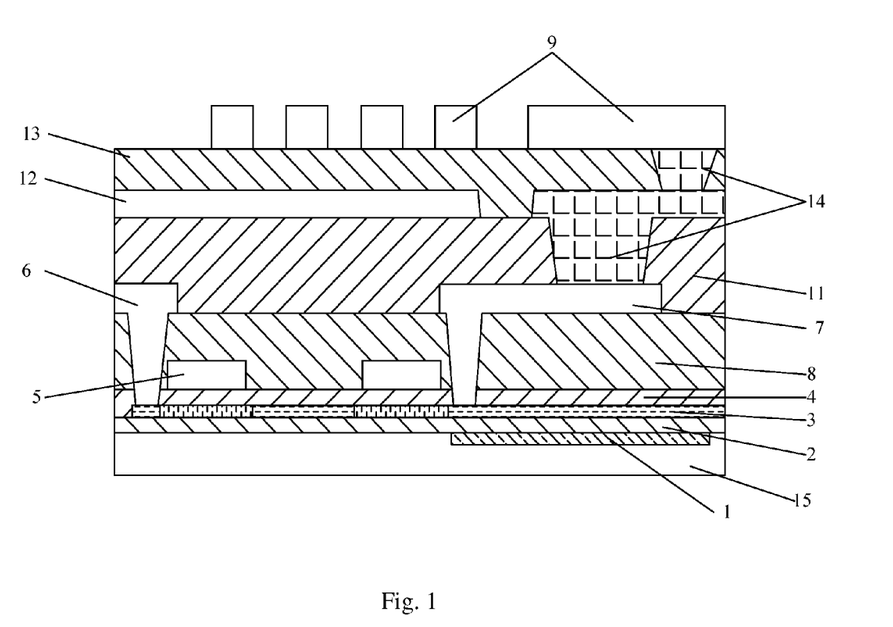
FIG. 1 is sectional view 1 of a pixel unit structure according to one embodiment of the invention.

One embodiment of the invention provides a pixel unit structure, as shown in FIG. 1, which comprises a thin film transistor (TFT) and a first barrier layer, wherein the first barrier layer is opposite to a drain region of an active layer of the TFT and is connected to a common electrode of an array substrate, thereby a capacitor is formed between the first barrier layer and the drain region of the active layer.

Specifically, the pixel unit structure comprises from bottom to top, in turn, a first barrier layer 1, a first insulating layer 2, an active layer 3, a second insulating layer 4, a gate electrode 5, a source electrode 6, a drain electrode 7 located on the same layer with the source electrode 6, and a third insulating layer 8.

In the pixel unit structure, the first barrier layer 1 is opposite to the drain region of the active layer 3, the source electrode 6 is connected to a data line of the pixel unit structure and a source region of the active layer 3, the drain electrode 7 is connected to the pixel electrode 9 of the pixel unit structure and the drain region of the active layer 3, the first barrier layer 1 is connected to an output terminal of the common electrode of the array substrate, thereby a capacitor is formed between the first barrier layer 1 and the drain region of the active layer 3. Herein, for a TFT with a pixel unit structure, whether P type or N type, the source electrode and the drain electrode of the TFT may be interchanged, the electrode connected to the data line is defined as the source electrode, and the electrode connected to the pixel electrode is defined as the drain electrode.

When single frame is displayed, an electrical signal is input to the gate electrode 5, a region between the source region and the drain region on the active layer 3 is switched into conduction, the data line of the pixel unit structure transmits an electrical signal with a certain potential to the source electrode 6, and the electrical signal may be transmitted to the drain electrode 7 via the active layer 3, thereby it is transmitted to the pixel electrode 9 connected with the drain electrode 7 via the drain electrode 7, so that the pixel electrode 9 and the common electrode of the liquid crystal display jointly control the deflection and arrangement of the liquid crystal molecules between the pixel electrode 9 and the common electrode, thereby the image display of the liquid crystal display can be realized.

Moreover, the first barrier layer 1 is usually made of a metal, for example, molybdenum and aluminum, etc., and the first barrier layer 1 is connected with the output terminal of the common electrode of the array substrate. Further, as shown in FIG. 1, the first barrier layer 1 is opposite to the drain region of the active layer, a first insulating layer 2 is interposed between the first barrier layer 1 and the drain region, and a potential difference exists between the first barrier layer 1 and the drain region of the active layer. Thus, the first barrier layer 1 together with the drain region forms a storage capacitor, which helps to keep the potential difference between the pixel electrode 9 and the common electrode and is favorable for a liquid crystal molecule to maintain the arrangement required for normal display during the time period of single frame, and can improve display effect of the liquid crystal display.

It can be seen from FIG. 1 that, the storage capacitor is jointly determined by the overlapped area between the first barrier layer 1 and the drain region, and the thickness and the dielectric constant of the insulating material (that is, the material of the first insulating layer 2) between the first barrier layer 1 and the drain electrode. In consideration of the effect and the saving of materials, etc., the first barrier layer 1 and the drain region are both closely adhered to the first insulating layer 2, and as shown in FIG. 2, the projection region of the first barrier layer 1 on the first insulating layer 2 completely overlaps with the projection region of the drain region on the first insulating layer 2.

Figure 2:
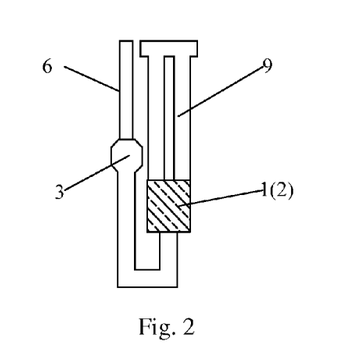
FIG. 2 is plan view 1 of a part of the pixel unit structure according to one embodiment of the invention.

Moreover, as shown in FIG. 2, because the projection region of the first barrier layer 1 on the first insulating layer 2 completely overlaps with the projection region of the drain electrode on the first insulating layer 2, the aperture ratio of the pixel unit structure will not be influenced, thereby a high aperture ratio of the pixel unit structure can be obtained. In the prior art, due to the existence of a via hole, a very large interval is required between the drain region of the active layer and the GATE metal for forming a storage capacitor together with the drain region of the active layer, thus the aperture ratio of the pixel unit will be severely influenced.

It should be noted that, the first insulating layer 2 is used to be referred to as a buffer layer, the second insulating layer 4 is used to be referred to as a gate insulator (GI, for short), and the third insulating layer 8 is used to be referred to as an inter layer dielectric (ILD, for short), wherein the materials of the first insulating layer 2, the second insulating layer 4 and the third insulating layer 8 may all be one of silicon nitride, silicon dioxide or its mixtures, and the materials of the first insulating layer 2, the second insulating layer 4 and the third insulating layer 8 may be the same.

In the technical solution of this embodiment, a capacitor can be formed by the first barrier layer together with the drain region of the active layer that is connected with the pixel electrode, so that storage capacitor can be provided in the pixel unit structure. Additionally, because the first barrier layer that forms a storage capacitor together with the drain region is opposite to the drain region connected with the pixel electrode, the aperture ratio of the pixel unit structure will not be influenced, and thereby a high aperture ratio of the pixel unit structure can be obtained.

Embodiment 2

Figure 3:
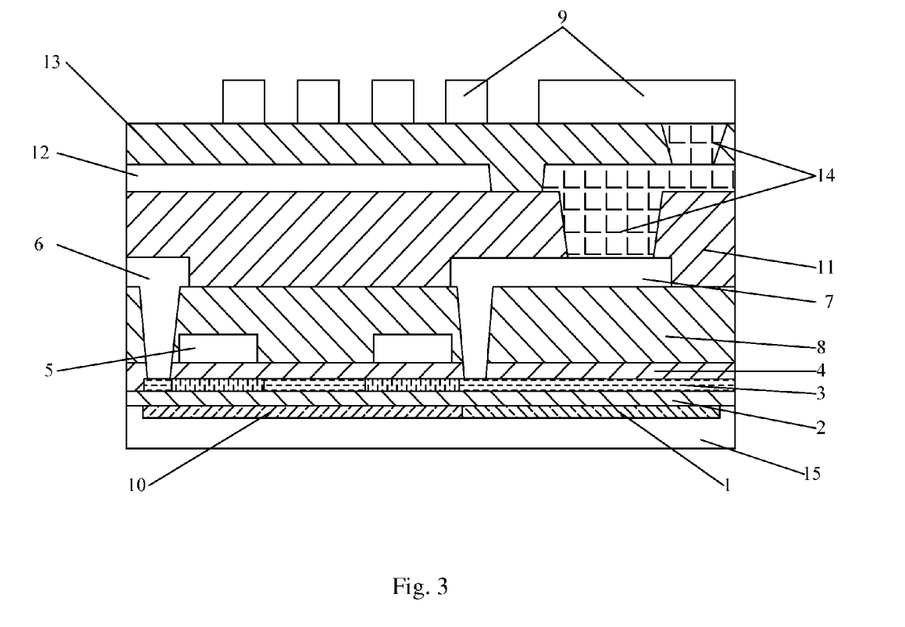
FIG. 3 is sectional view 2 of the pixel unit structure according to one embodiment of the invention.

One embodiment of the invention provides a pixel unit structure, as shown in FIG. 3, based on Embodiment 1, the pixel unit structure may further include a second barrier layer 10 that is located on the same layer with the first barrier layer 1, wherein the second barrier layer 10 is opposite to the region on the active layer 3 other than the drain region.

Figure 4:
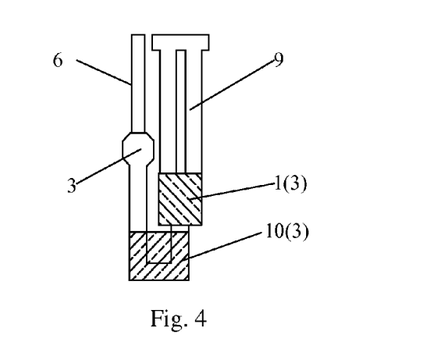
FIG. 4 is plan view 2 of a part of the pixel unit structure according to one embodiment of the invention.

Because, in fact, the pixel unit structure usually is an N-type TFT, of which the drain electrode current is larger than that of a P-type TFT, especially, in the case of light irradiation, excess light beams scatter or directly irradiate on the active region of the TFT, and the edge region of a channel is excited to generate electron-hole pairs, wherein a part of the electron-hole pairs form a drain electrode current, thus the drain electrode current will be increased remarkably, and the time length required by the pixel electrode 9 to maintain a stable potential will be shortened greatly. Even if a storage capacitor exists, the existence of a drain electrode current will have a substantial influence, thus it needs to reduce the value of the drain electrode current as much as possible. As a result, as shown in FIG. 3 or 4, a second barrier layer 10, which is opposite to the region on the active layer 3 other than the source region, is usually provided in the pixel unit structure, wherein the second barrier layer 10 blocks the light beams that may irradiate on the region on the active layer 3 other than the source region, and thus the increase of the drain electrode current is prevented. Therefore, a second barrier layer 10 generally needs to be provided in the pixel unit structure.

The first barrier layer 1 and the second barrier layer 10 may be manufactured by the same procedure in the technological process for manufacturing the pixel unit structure, without the need of additional processes to manufacture the storage capacitor, which insure that manufacturing cost of the pixel unit may be low.

Moreover, when the drive mode of the pixel unit structure is ADS mode, the pixel unit structure further comprises:

a fourth insulating layer 11, a common electrode layer 12, a fifth insulating layer 13 and a pixel electrode 9 provided on the third insulating layer 8 in turn, wherein the third insulating layer 8, the fourth insulating layer 11 and the fifth insulating layer 13 all have via holes 14, and each of via holes 14 is filled with a conducting material connected with each other. The positions of the common electrode layer 12 and the pixel electrode 9 may be interchanged, so long as an electric field is formed between the common electrode layer 12 and the pixel electrode 9.

Therefore, the drain electrode 7 of the active layer 3 may be connected to the pixel electrode 9 via the conducting material connected with each other, and usually, the conducting material may be nanometer Indium Tin Oxides (ITO, for short).

The drain electrode is connected to the pixel electrode 9 by the conducting material connected in via hole, rather than by other connection modes, so that the manufacturing process of the pixel unit structure may be simplified, and the reduction of the aperture ratio of the pixel unit structure may be prevented.

Usually, the active layer 3 is formed of monocrystalline silicon, or is formed of lightly-doped polysilicon and heavily-doped polysilicon alternately, the active region of the active layer 3 is formed of monocrystalline silicon or lightly-doped polysilicon; and the material of the source region and the drain region of the active layer 3 is heavily-doped polysilicon.

"Doping" means to a process directed to impurity semiconductor, which means that a 3-valence or 5-valence element is doped into an intrinsic semiconductor (here, monocrystalline silicon) to make it an acceptor impurity that provides an electron hole to a valence band or a donor impurity that send an electron to a conduction band. "Heavy doping" means that the concentration of the impurity doped into the intrinsic semiconductor is higher.

As shown in FIG. 1 or FIG. 3, the pixel unit structure has at least one gate electrode 5, and the monocrystalline silicon or the lightly-doped polysilicon in the active layer 3 is opposite to the gate electrode 5. The increase of the number of the gate electrodes 5 means the increase of the total amount of the polysilicon between the source region and the drain region in the active layer 3 and the increase of the resistance between the source electrode and the drain electrode, which is favorable to further reduce the drain electrode current in the active layer 3, and thus is favorable for the potential stability of the pixel electrode 9.

Figure 5:
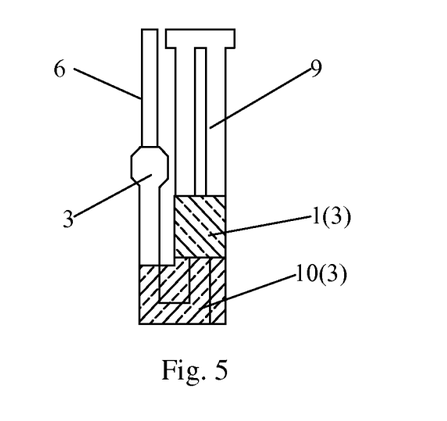
FIG. 5 is plan view 3 of a part of the pixel unit structure according to one embodiment of the invention.

Usually, as shown in FIG. 5, in order to simplify the manufacturing process and reduce the cost of the mask, the first barrier layer 1 and the second barrier layer 10 may be formed integrally.

Moreover, one embodiment of the invention further provides an array substrate, as shown in FIG. 1, which includes a substrate 15 and a plurality of the pixel unit structures located on the substrate 15. Wherein, the first barrier layer 1 of each of the pixel unit structures is respectively connected to an output terminal of the common electrode of the array substrate (not shown). Alternatively, the first barrier layer of each of the pixel unit structures 1 is connected with each other in series, and then is connected to an output terminal of the common electrode of the array substrate (not shown).

Figure 6:
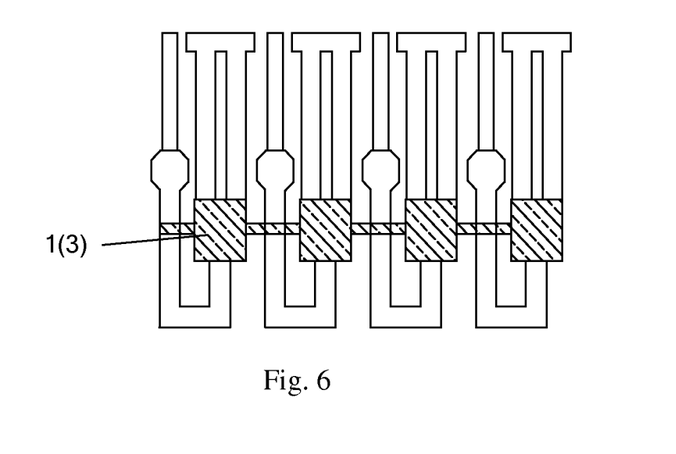
FIG. 6 is plan view 1 of an array substrate according to one embodiment of the invention.
Figure 7:
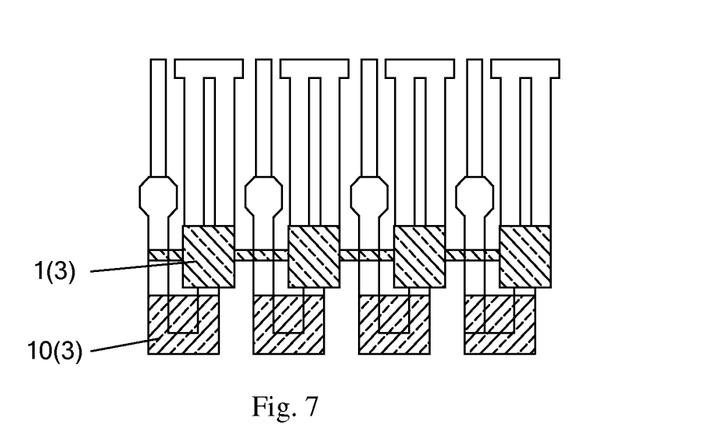
FIG. 7 is plan view 2 of an array substrate according to one embodiment of the invention.
Figure 8:
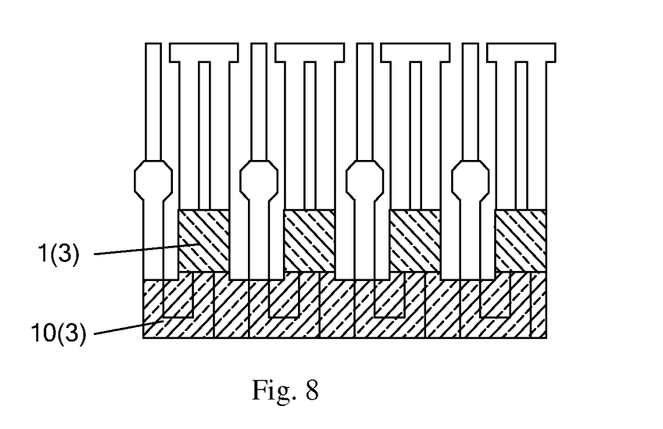
FIG. 8 is plan view 3 of an array substrate according to one embodiment of the invention.

The connection between the first barrier layer 1 and the output terminal of the common electrode of the array substrate is not limited, wherein the first barrier layer 1 of each of pixel unit structure in the display region may be respectively connected to the output terminal of the common electrode of the array substrate, or as shown in FIG. 6, FIG. 7 or FIG. 8, after each first barrier layer 1 is connected with each other in series, they will be connected inside or outside the display region to the output terminal of the common electrode of the array substrate.

Moreover, there may be various specific connection forms between the first barrier layer 1 and the output terminal of the common electrode of the array substrate, wherein the first barrier layer 1 may be connected with the output terminal of the common electrode of the array substrate by a via hole filled with a conducting material, or it may be jointly realized by a via hole filled with a conducting material and a conducting layer, which is not limited in the embodiments of the invention.

The above description only shows some specific embodiments of the invention. However, the protection scope of the invention is not limited thereto. All the variations and substitutions made by one of ordinary skills in the art in the technical scope disclosed will pertain to the protection scope of the invention. Therefore, the protection scope of the invention should be defined by the appended claims.

What is claimed is:

1. A pixel unit structure, comprising a thin film transistor and a first barrier layer, wherein the first barrier layer is opposite to a drain region of an active layer of the thin film transistor, and the first barrier layer is connected to a common electrode of an array substrate, and a capacitor is formed between the first barrier layer and the drain region of the active layer.

2. The pixel unit structure according to claim 1, wherein the thin film transistors comprises an active layer, a second insulating layer, a gate electrode, and a source electrode and a drain electrode located on the same layer,
wherein the source electrode is connected to a data line of the pixel unit structure and a source region of the active layer, and the drain electrode is connected to a pixel electrode of the pixel unit structure and a drain region of the active layer.

3. The pixel unit structure according to claim 1, further comprising a second barrier layer located on the same layer with the first barrier layer, wherein the second barrier layer is opposite to the region of the active layer other than the drain region.

4. The pixel unit structure according to claim 1, further comprising
a third insulating layer, a fourth insulating layer, a common electrode layer, a fifth insulating layer and a pixel electrode, wherein the fourth insulating layer, the common electrode layer, the fifth insulating layer and the pixel electrode are provided on the third insulating layer in turn, and wherein the third insulating layer, the fourth insulating layer and the fifth insulating layer all have via holes, each of via holes is filled with a conducting material connected with each other, wherein the drain electrode or the source electrode of the active layer is connected to the pixel electrode via the conducting material connected with each other, or
a third insulating layer, a fourth insulating layer, a pixel electrode, a fifth insulating layer and a common electrode layer, wherein the fourth insulating layer, the pixel electrode, the fifth insulating layer and the common electrode layer are provided on the third insulating layer in turn, and wherein the third insulating layer, the fourth insulating layer and the fifth insulating layer all have via holes, each of via holes is filled with a conducting material connected with each other, wherein the drain electrode is connected to the pixel electrode via the conducting material connected with each other.

5. The pixel unit structure according to claim 1, wherein the active layer is formed of monocrystalline silicon, or is formed of lightly-doped polysilicon and heavily-doped polysilicon alternately.

6. The pixel unit structure according to claim 5, wherein the material of the source region and the drain region of the active layer is heavily-doped polysilicon.

7. The pixel unit structure according to claim 5, wherein the pixel unit structure has at least one gate electrode, and the monocrystalline silicon or the lightly-doped polysilicon in the active layer is opposite to the gate electrode.

8. The pixel unit structure according to claim 3, wherein the first barrier layer and the second barrier layer are formed integrally.

9. An array substrate, comprising a substrate and a plurality of pixel unit structures according to claim 1 located on the substrate; wherein,
the first barrier layer of each of the pixel unit structures is connected to the common electrode of the array substrate, respectively; or
the first barrier layers of the pixel unit structures are connected with each other in series, and they are connected to the common electrode of the array substrate.

10. A display device, comprising the array substrate according to claim 9.

11. The array substrate according to claim 9, wherein the thin film transistors comprises an active layer, a second insulating layer, a gate electrode, and a source electrode and a drain electrode located on the same layer,
wherein the source electrode is connected to a data line of the pixel unit structure and a source region of the active layer, and the drain electrode is connected to a pixel electrode of the pixel unit structure and a drain region of the active layer.

12. The array substrate according to claim 9, further comprising a second barrier layer located on the same layer with the first barrier layer, wherein the second barrier layer is opposite to the region of the active layer other than the drain region.

13. The array substrate according to claim 9, further comprising
a third insulating layer, a fourth insulating layer, a common electrode layer, a fifth insulating layer and a pixel electrode, wherein the fourth insulating layer, the common electrode layer, the fifth insulating layer and the pixel electrode are provided on the third insulating layer in turn, and wherein the third insulating layer, the fourth insulating layer and the fifth insulating layer all have via holes, each of via holes is filled with a conducting material connected with each other, wherein the drain electrode or the source electrode of the active layer is connected to the pixel electrode via the conducting material connected with each other, or
a third insulating layer, a fourth insulating layer, a pixel electrode, a fifth insulating layer and a common electrode layer, wherein the fourth insulating layer, the pixel electrode, the fifth insulating layer and the common electrode layer are provided on the third insulating layer in turn, and wherein the third insulating layer, the fourth insulating layer and the fifth insulating layer all have via holes, each of via holes is filled with a conducting material connected with each other, wherein the drain electrode is connected to the pixel electrode via the conducting material connected with each other.

14. The array substrate according to claim 9, wherein the active layer is formed of monocrystalline silicon, or is formed of lightly-doped polysilicon and heavily-doped polysilicon alternately.

15. The array substrate according to claim 14, wherein the material of the source region and the drain region of the active layer is heavily-doped polysilicon.

16. The array substrate according to claim 14, wherein the pixel unit structure has at least one gate electrode, and the monocrystalline silicon or the lightly-doped polysilicon in the active layer is opposite to the gate electrode.

17. The array substrate according to claim 12, wherein the first barrier layer and the second barrier layer are formed integrally.

18. A display device, comprising the array substrate according to claim 10.

19. A display device, comprising the array substrate according to claim 11.

20. A display device, comprising the array substrate according to claim 12.

* * * * *

UNITED STATES PATENT AND TRADEMARK OFFICE
CERTIFICATE OF CORRECTION

PATENT NO. : 9,054,198 B2  
APPLICATION NO. : 14/081244  
DATED : June 9, 2015  
INVENTOR(S) : Xiaojing Qi et al.

Page 1 of 1

It is certified that error appears in the above-identified patent and that said Letters Patent is hereby corrected as shown below:

Title Page – Foreign Application Priority Data – please insert:

--(30) CN201210459334.6 filed November 15, 2012-- and

--CN201210501139.5 filed November 29, 2012--

Signed and Sealed this  
Fifth Day of January, 2016

Michelle K. Lee  
*Director of the United States Patent and Trademark Office*